United States Patent
Maeda et al.

(10) Patent No.: US 6,468,821 B2
(45) Date of Patent: Oct. 22, 2002

(54) METHOD FOR FABRICATING SEMICONDUCTOR LIGHT-EMITTING UNIT

(75) Inventors: Toshihide Maeda; Kunihiko Obara; Tomio Inoue, all of Kagoshima (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 23 days.

(21) Appl. No.: 09/947,405

(22) Filed: Sep. 7, 2001

(65) Prior Publication Data

US 2002/0028527 A1 Mar. 7, 2002

Related U.S. Application Data

(62) Division of application No. 09/479,847, filed on Jan. 10, 2000.

(30) Foreign Application Priority Data

Jan. 11, 1999 (JP) .......................................... 11-003788

(51) Int. Cl.[7] .............................................. H01L 21/00
(52) U.S. Cl. ...................................................... 438/29
(58) Field of Search ............................... 438/29, 22–28, 438/33, 34–35, 881

(56) References Cited

U.S. PATENT DOCUMENTS 5,557,115 A 9/1996 Shakuda
5,998,925 A * 12/1999 Shimizu et al. ............. 313/503

FOREIGN PATENT DOCUMENTS

| DE | 298 04 149 | 6/1998 |
|----|------------|--------|
| JP | 07-99345 | 4/1995 |
| JP | 11-40848 | 2/1999 |
| WO | 98/34285 | 8/1998 |

OTHER PUBLICATIONS

Derwent publication No. 1998–223190 Absract of Abstracted Pub. No. JP 10065221A "Light emitting diode structure—includes first sealing resin which contains fluorescent material for converting wavelength of light emitted from chip or . . . ".*
European Search Report dated Jun. 22, 2001.

* cited by examiner

Primary Examiner—Keith Christianson
Assistant Examiner—Craig Thompson
(74) Attorney, Agent, or Firm—Eric J. Robinson; Nixon Peabody LLP

(57) ABSTRACT

A composite light-emitting device according to the present invention includes a light-emitting element including a transparent substrate and a multilayer structure formed on the substrate. The multilayer structure includes first and second semiconductor layers of first and second conductivity types, respectively. The device further includes a submount member for mounting the light-emitting element thereon. The principal surface of the submount member faces the multilayer structure. The submount member is electrically connected to the light-emitting element. The light-emitting element is covered with a wavelength-shifting resin member. The resin member is provided on the principal surface of the submount member and contains a photofluorescent or filtering compound. The photofluorescent compound shifts the wavelength of radiation that has been emitted from the light-emitting element, while the filtering compound partially absorbs the radiation.

4 Claims, 13 Drawing Sheets

METHOD FOR FABRICATING SEMICONDUCTOR LIGHT-EMITTING UNIT

This application is a Division of the Ser. No. 09/479,847 filed Jan. 10, 2000.

BACKGROUND OF THE INVENTION

The present invention relates to a composite light-emitting device including a light-emitting element such as light-emitting diode or laser diode, which is implemented as multiple semiconductor layers stacked on a transparent substrate, and a resin member. The resin member may contain a photofluorescent compound that shifts the wavelength of the radiation emitted from the light-emitting element or a filtering compound that partially absorbs the radiation. The present invention also relates to a semiconductor light-emitting unit including the composite light-emitting device and to a method for fabricating the same.

A technique of shifting the wavelength of radiation emitted from a light-emitting element using some phosphor has been well known in the art. For example, according to a technique, the inner wall of a glass neon tube is coated with a phosphor, thereby changing orange light into green one. As an alternative, a photofluorescent compound is added into a molding resin compound for a gallium arsenide (GaAs) light-emitting diode (LED) to convert red emission into green one. Recently, a white LED lamp, which emits white light by coating a blue-light-emitting diode of a Group III nitride semiconductor like gallium nitride (GaN) with a photofluorescent compound, was put on the market. In this specification, such an LED will be simply referred to as a "GaN LED".

Hereinafter, a prior art white LED lamp will be described with reference to the accompanying drawings.

FIG. 14 illustrates a cross-sectional structure of a conventional white LED lamp. As shown in FIG. 14, the lamp includes: a first leadframe 100A, which is provided with a reflective cup 100a at the end; and a second leadframe 100B, the end of which is spaced apart from that of the reflective cup 100a. A GaN LED 110 is bonded onto the bottom of the reflective cup 100a with an insulating adhesive 101. One of the electrodes of the GaN LED 110 is connected to the first leadframe 100A with a first wire 102A, while the other electrode thereof is connected to the second leadframe 100B with a second wire 102B. The reflective cup 100a is filled in with a wavelength-shifting resin medium 104, which contains a photoflorescent compound that shifts the wavelength of the radiation emitted from the GaN LED 110, so as to cover the GaN LED 110. The upper ends of the first and second leadframes 100A and 100B, as well as the reflective cup 100a, are molded together within a spherical resin encapsulant 105 such as transparent epoxy resin to form the white LED lamp.

Although not shown in any drawing, a chip LED may also be formed without using the reflective cup 100a or the spherical resin encapsulant 105. In the chip LED, the GaN LED 110 is mounted onto a concave receptacle within a casing and then the gap between the LED 110 and the receptacle is filled in with a resin encapsulant containing a photofluorescent compound to secure them together.

Next, a detailed construction of the known GaN LED 110 will be described.

FIGS. 15(a) and 15(b) illustrate the GaN LED for use in the conventional white LED lamp: FIG. 15(a) illustrates a planar layout thereof; and FIG. 15(b) illustrates a cross-sectional structure thereof taken along the line XVb—XVb in FIG. 15(a). As shown in FIG. 15(b), the GaN LED 110 includes n-type GaN contact layer 112, quantum well structure and p-type GaN contact layer 116, which are stacked in this order over a sapphire substrate 111. The quantum well structure is formed on part of the upper surface of the n-type contact layer 112 and includes n-type AlGaN first barrier layer 113, InGaN single quantum well (SQW) layer 114 and p-type AlGaN second barrier layer 115.

Also, as shown in FIG. 15(a), an n-side electrode 117 is formed on the exposed part of the upper surface of the n-type contact layer 112. A current-diffusing transparent electrode 118 is formed on the p-type contact layer 116. And a p-side electrode 119 is formed on the transparent electrode 118 to be located farthest from the n-side electrode 117.

Since the conventional GaN LED 110 is formed on the insulating sapphire substrate 111, both the n- and p-side electrodes 117 and 119 are provided on the same side of the substrate 111 as that including the LED thereon.

The conventional white LED lamp shown in FIG. 14 or the chip LED (not shown) covers the GaN LED 110 by filling in the reflective cup 100a or the receptacle of the casing with the wavelength-shifting resin medium 104 containing the photofluorescent compound 103. Thus, the prior art construction is not applicable to a light-emitting unit including no such reflective cup 100a or receptacle.

Also, if the reflective cup 100a or receptacle should be filled in with the wavelength-shifting resin medium 104, it is difficult to precisely control the amount of the resin medium to be filled in or the variation in concentration of the photofluorescent compound 103. Thus, the chromaticity changes significantly. As a result, the yield of good light-emitting units with a desired chromaticity decreases.

Furthermore, the GaN LED 110 included in the white LED lamp or chip LED is the same as that included in a blue LED lamp. The blue-light-emitting diode is poorly resistant to static electricity due to the physical constants (like the relative dielectric constant ∈) of the constituent materials thereof or the structure thereof.

SUMMARY OF THE INVENTION

A first object of the present invention is getting a composite light-emitting device always covered with a wavelength-shifting resin medium irrespective the shapes of leadframes or casings.

A second object of the present invention is improving the resistance of a composite light-emitting device or semiconductor light-emitting unit to an overvoltage caused by static electricity.

A third object of the present invention is making the chromaticity of the emission finely adjustable while at the same time suppressing the variation in chromaticity.

To achieve the first object, an inventive composite light-emitting device includes a light-emitting element and a submount member. The light-emitting element with an active region defined on a transparent substrate is mounted facedown on the submount member with the active region of the light-emitting element facing the principal surface of the submount member. The submount member is electrically connected to the light-emitting element. And the light-emitting element is covered with a wavelength-shifting resin medium on the principal surface of the submount member.

To accomplish the second object, the submount member is implemented as an overvoltage protector.

To attain the third object, the light-emitting face of the substrate for the light-emitting element on the opposite side to its circuitry side and/or the outer surface of the wavelength-shifting resin medium above the light-emitting face are/is made parallel to the back surface of the submount member.

Specifically, a composite light-emitting device according to the present invention includes a light-emitting element including a transparent substrate and a multilayer structure formed on the substrate. The multilayer structure includes first and second semiconductor layers of first and second conductivity types, respectively. The device further includes a submount member for mounting the light-emitting element thereon. The principal surface of the submount member faces the multilayer structure. The submount member is electrically connected to the light-emitting element. The device further includes a wavelength-shifting resin member, which is provided on the principal surface of the submount member to cover the light-emitting element. The wavelength-shifting resin member contains a photofluorescent or filtering compound. The photofluorescent compound shifts the wavelength of radiation that has been emitted from the light-emitting element. The filtering compound partially absorbs the radiation.

In the composite light-emitting device according to the present invention, the multilayer structure of the light-emitting element, which functions as active region of the element, is flip-chip bonded to the principal surface of the submount member. And the radiation emitted is allowed to pass through the backside of the substrate for the light-emitting element. Accordingly, the submount member, on which the light-emitting element is mounted, supports the wavelength-shifting resin member thereon, or acts as a receptacle for the resin member. Thus, the light-emitting element can be covered with the wavelength-shifting resin member irrespective of the shape of a leadframe or a mount of a casing.

In one embodiment of the present invention, the principal surface of the submount member is preferably greater in area than that of the substrate for the light-emitting element and is preferably rectangular with a side of about 0.25 mm or more.

In another embodiment, the light-emitting element preferably includes: a first electrode formed on the multilayer structure and electrically connected to the first semiconductor layer; and a second electrode electrically connected to the second semiconductor layer. The submount member is preferably an overvoltage protector including first and second counter electrodes, which are formed on the principal surface thereof so as to face the first and second electrodes of the light-emitting element, respectively. When a voltage, which is lower than a dielectric breakdown voltage but exceeds a predetermined voltage, is applied between the first and second electrodes of the light-emitting element, a current preferably flows between the first and second counter electrodes.

In such an embodiment, even if a voltage equal to or higher than a dielectric breakdown voltage is applied between the first and second electrodes of the light-emitting element due to static electricity, for example, a bypass current flows between the two electrodes of the overvoltage protector. As a result, the light-emitting element can be protected without causing any dielectric breakdown.

In this particular embodiment, the first and second electrodes of the light-emitting element are preferably n- and p-side electrodes, respectively, and the overvoltage protector is preferably a diode using the first and second counter electrodes as anode and cathode, respectively.

More specifically, a forward operating voltage of the diode is preferably lower than a reverse dielectric breakdown voltage of the light-emitting element. And a reverse breakdown voltage of the diode is preferably higher than an operating voltage of the light-emitting element but lower than a forward dielectric breakdown voltage of the light-emitting element.

In an alternate embodiment, the first and second electrodes are preferably connected electrically to the first and second counter electrodes, respectively, with microbumps interposed therebetween.

Specifically, the microbumps are preferably fused and bonded together with the associated electrodes facing the bumps. The overvoltage protector preferably includes a backside electrode on another surface thereof opposite to the principal surface. One of the first and second counter electrodes preferably includes a bonding pad to be electrically connected to an external component. And the polarity of the backside electrode is preferably opposite to that of the first or second counter electrode that includes the bonding pad.

More particularly, the first and second semiconductor layers of the light-emitting element are preferably made of Group III nitride compound semiconductors, and the overvoltage protector is preferably a lateral diode made of silicon. P- and n-type semiconductor regions are defined in an upper part thereof closer to the principal surface.

In another embodiment of the present invention, the light-emitting element may include: a first electrode formed on the multilayer structure and electrically connected to the first semiconductor layer; and a second electrode electrically connected to the second semiconductor layer. The submount member may be an auxiliary member made of a conductor. The submount member may include: a first counter electrode, which is formed on the principal surface thereof so as to face the first electrode of the light-emitting element and is electrically isolated from the conductor; and a second counter electrode, which is formed on the principal surface thereof so as to face the second electrode of the light-emitting element and is electrically continuous with the conductor.

In this particular embodiment, the first and second electrodes are preferably connected electrically to the first and second counter electrodes, respectively, with microbumps interposed therebetween.

Specifically, the microbumps are preferably fused and bonded together with the associated electrodes facing the bumps. The auxiliary member preferably includes a backside electrode on another surface thereof opposite to the principal surface. One of the first and second counter electrodes preferably includes a bonding pad to be electrically connected to an external component. And the backside electrode is preferably continuous electrically with the first or second counter electrode that includes no bonding pads.

More particularly, the first and second semiconductor layers of the light-emitting element are preferably made of Group III nitride compound semiconductors, and the auxiliary member is preferably made of conductive silicon.

In still another embodiment, the wavelength-shifting resin member is preferably made of a transparent resin containing the photofluorescent compound at about 50 to about 90 percent by weight.

In this particular embodiment, a light-emitting surface of the substrate for the light-emitting element on the opposite side to another surface thereof on which the multilayer structure is formed and/or an outer surface of part of the wavelength-shifting resin member above the light-emitting surface are/is preferably substantially parallel to a surface of the submount member on which the backside electrode is formed. This is because the variation in chromaticity of the emitted radiation, which usually greatly depends on the thickness of that part of the wavelength-shifting resin member above the light-emitting surface of the light-emitting element, can be suppressed by doing so.

Specifically, the thickness of the part of the wavelength-shifting resin member above the light-emitting surface is preferably in a range from approximately 20 µm to approximately 110 µm, both inclusive.

Alternatively, the thickness of a part of the wavelength-shifting resin member covering the light-emitting surface and sides of the light-emitting element is preferably in the range from approximately 20 µm to approximately 110 µm, both inclusive.

A semiconductor light-emitting unit according to the present invention includes: a composite light-emitting device including a light-emitting element and a submount member for mounting the light-emitting element thereon; a leadframe or wiring board including a mount for supporting a surface of the submount member on the opposite side to the principal surface thereof on which the light-emitting element is mounted; and a transparent resin encapsulant covering the mount as well as the composite light-emitting device. The light-emitting element includes a transparent substrate and a multilayer structure formed on the substrate. The multilayer structure includes first and second semiconductor layers of first and second conductivity types, respectively. The principal surface of the submount member faces the multilayer structure. The submount member is electrically connected to the light-emitting element. And the light-emitting element is covered with a wavelength-shifting resin member, which is provided on the principal surface of the submount member and contains a photofluorescent or filtering compound. The photofluorescent compound shifts the wavelength of radiation that has been emitted from the light-emitting element. The filtering compound partially absorbs the radiation.

An inventive semiconductor light-emitting unit can be formed easily to include the composite light-emitting device of the present invention.

In one embodiment of the present invention, the submount member preferably includes a bonding. pad, which is formed on the principal surface thereof and electrically connected to the light-emitting element. The submount member preferably further includes a backside electrode, which is formed on another surface thereof opposite to the principal surface on which the light-emitting element is mounted. The backside electrode and the mount are preferably bonded together with a conductive paste. And the bonding pad is preferably connected electrically to a member other than the mount via a wire.

A first exemplary method for fabricating a semiconductor light-emitting unit according to the present invention includes the step of making a light-emitting element by forming a multilayer structure on a transparent substrate and forming electrodes on the multilayer structure. The multilayer structure includes first and second semiconductor layers of first and second conductivity types, respectively. The method further includes the step of making a submount member including counter electrodes on the principal surface thereof. The counter electrodes face the electrodes of the light-emitting element. The method further includes the steps of: forming microbumps on the electrodes or on the counter electrodes; mounting the light-emitting element facedown on the principal surface of the submount member such that the multilayer structure faces the principal surface and that the electrodes of the light-emitting element are electrically connected to the counter electrodes via the microbumps; and coating the light-emitting element with a wavelength-shifting resin medium that will be supported on the principal surface of the submount member when cured. The wavelength-shifting resin medium contains a photofluorescent or filtering compound. The photofluorescent compound shifts the wavelength of radiation that has been emitted from the light-emitting element. The filtering compound absorbs the radiation partially.

According to the first method of the present invention, the inventive semiconductor light-emitting unit can be fabricated just as intended.

A second exemplary method for fabricating a semiconductor light-emitting unit according to the present invention includes the step of a) making multiple light-emitting elements by forming a multilayer structure on each of a plurality of transparent substrates and forming electrodes on the multilayer structure. The multilayer structure includes first and second semiconductor layers of first and second conductivity types, respectively. The method further includes the step of b) making multiple submount members on a wafer. Each said submount member includes: a bonding pad on the principal surface thereof; counter electrodes that face the electrodes of associated one of the light-emitting elements; and a backside electrode on another surface thereof opposite to the principal surface. The method further includes the steps of: c) forming microbumps on the electrodes or on the counter electrodes by a stud bump forming or plating technique; d) bringing the electrodes of each said light-emitting element into contact with the counter electrodes of associated one of the submount members via the microbumps and fusing the microbumps by applying ultrasonic waves or heat thereto such that the microbumps and the associated electrodes are bonded together, thereby electrically connecting the light-emitting elements to the associated submount members and bonding the light-emitting elements onto the respective principal surfaces of the submount members; and e) coating each said light-emitting element with a wavelength-shifting resin medium that will be supported on the principal surface of the associated submount member and then curing the wavelength-shifting resin medium, thereby obtaining a plurality of composite light-emitting devices, each including one of the light-emitting elements and associated one of the submount members. The wavelength-shifting resin medium contains a photofluorescent or filtering compound. The photofluorescent compound shifts the wavelength of radiation that has been emitted from the light-emitting element and the filtering compound absorbs the radiation partially. The method further includes the steps of: f) dicing the wafer, on which the composite light-emitting devices have been formed, into multiple chips; g) securing each said composite light-emitting device, which is included on one of the chips, onto a mount of a leadframe or a wiring board such that the backside electrode of the submount member thereof is bonded to the mount via a conductive paste; and h) connecting the bonding pad of each said submount member to the associated leadframe or wiring board with a wire.

According to the second method of the present invention, the submount members, which will support the wavelength-shifting resin member thereon, are handled before these members are cut out from the wafer. Thus, the wavelength-shifting resin medium can be supplied not just by using a dispenser but by some patterning technique for a wafer, e.g., screen printing. Accordingly, the resin medium can be shaped accurately and efficiently.

In one embodiment of the present invention, the second method may further include, between the steps d) and e), the step of polishing a light-emitting surface of the substrate for each said light-emitting element on the opposite side to another surface thereof on which the multilayer structure is formed such that the light-emitting surface becomes substantially parallel to a surface of the associated submount member on which the backside electrode is formed.

In an alternate embodiment, the second method may further include, between the steps e) and f), the step of polishing an outer surface of part of the wavelength-shifting resin medium above each said light-emitting element such that the outer surface becomes substantially parallel to the surface of the associated submount member on which the backside electrode is formed.

DESCRIPTION OF THE PREFERRED EMBODIMENTS EMBODIMENT 1

Hereinafter, a first exemplary embodiment of the present invention will be described with reference to the accompanying drawings.

Figure 1A:
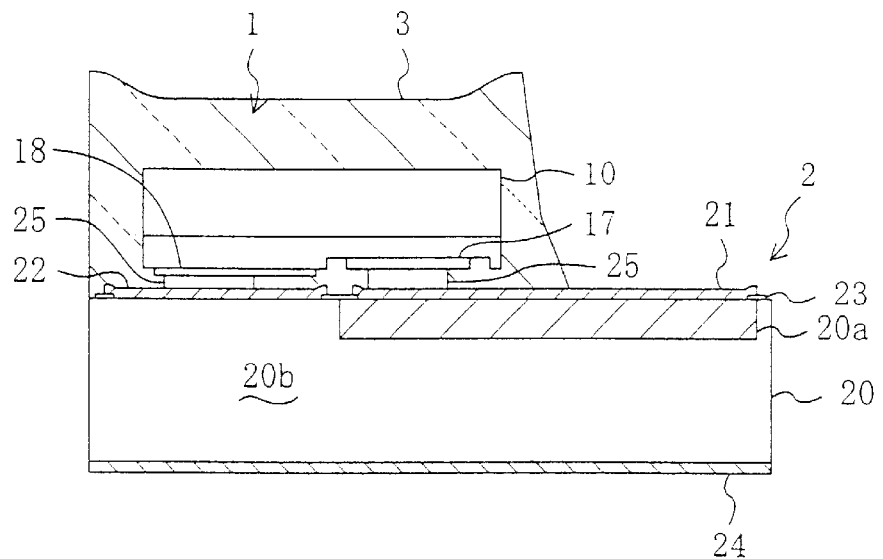
FIGS. 1(a) and 1(b) are respectively cross-sectional and plan views illustrating a composite light-emitting device according to a first embodiment of the present invention.
Figure 1B:
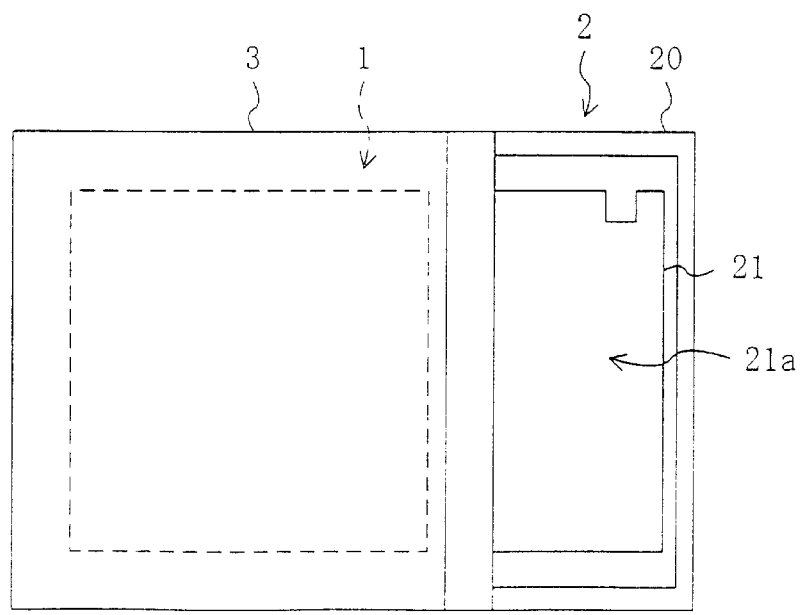

FIGS. 1(a) and 1(b) respectively illustrate a cross-section and a planar layout of a composite light-emitting device according to the first embodiment. As shown in FIG. 1(a), the composite light-emitting device includes a Group III nitride (e.g., GaN) LED 1, which is flip-chip bonded onto the principal surface of a diode 2 functioning as submount member. The entire surface of the LED 1 and part of the principal surface of the diode 2 are coated with a wavelength-shifting resin medium 3. The wavelength-shifting resin medium 3 contains, as an additive, a photofluorescent compound that shifts the wavelength of radiation emitted from the LED 1 or a filtering compound that absorbs the radiation partially.

The LED 1 includes a transparent sapphire substrate 10. In this case, the radiation emitted is allowed to pass through the upper surface (i.e., light-emitting surface) of the substrate 10 on the opposite side to another surface (i.e., lower surface) thereof facing the diode 2. On the lower surface of the substrate 10, n- and p-side electrodes 17 and 18, which are respectively connected to n- and p-type semiconductor layers of the LED 1, are formed.

The diode 2 includes a body 20 made of silicon (Si), for example. A p-type semiconductor region 20a is defined in the upper part of the body 20 under its exposed region and its region facing the n-side electrode 17 of the LED 1. The remaining portion of the body 20 is an n-type semiconductor region 20b. A p-side counter electrode 21 (i.e., first counter electrode) is formed on part of the principal surface of the body 20 over the p-type semiconductor region 20a. An n-side counter electrode 22 (i.e., second counter electrode) is formed on another part of the principal surface of the body 20 over the n-type semiconductor region 20b. An insulating film 23 of silicon dioxide, for example, is also formed on the principal surface of the body 20 so as to surround the p- and n-side counter electrodes 21 and 22. A backside electrode 24 is further formed on the back surface of the body 20, i.e., on the opposite side to the principal surface thereof, and is connected to the n-type semiconductor region 20b.

The n- and p-side electrodes 17 and 18 of the LED 1 are electrically connected to the p- and n-side counter electrodes 21 and 22 of the diode 2, respectively, by being bonded together with fused microbumps 25 of gold (Au). The diameter and height of each of these microbumps 25 are about 100 μm and about 15 μm, respectively.

The exposed part of the p-side counter electrode 21 functions as a bonding pad 21a. Electrical continuity may be established between the diode 2 and an external component using. the bonding pad 21a and the backside electrode 24.

The LED 1 and the diode 2 are preferably coated with the wavelength-shifting resin medium 3 by a screen printing process, because the wavelength-shifting resin medium 3 is patternable according to the technique. Alternatively, a potting process with a dispenser may be adopted. In such a case, however, one side of the diode chip 2 should preferably be longer than the diagonal of the LED chip 1 such that the wavelength-shifting resin medium 3 does not flow over the principal surface of the diode 2.

As can be seen, the composite light-emitting device according to the present invention is characterized by flip-chip bonding the blue-light-emitting diode 1, which is made of a Group III nitride poorly resistant to overvoltage, onto the protective diode 2 with the microbumps 25 interposed therebetween. The light-emitting device is also characterized by partially coating the principal surface of the diode 2 with the wavelength-shifting resin medium 3 such that the medium 3 will be received and supported on the surface when cured. Thus, the LED 1 can always be covered with the wavelength-shifting resin medium 3 irrespective of the shape of a leadframe for an LED lamp or a wiring board for a chip LED. That is to say, no reflective cup or no mounting receptacle needs to be included in assembling members of a light-emitting unit.

In general, to change the blue light emitted from the LED 1 into white one using the wavelength-shifting resin medium 3, a photofluorescent compound with a property changing blue emission into yellowish green one, which is the complementary color of blue, should be added to the wavelength-shifting resin medium 3. In such a case, part of the blue light emitted passes through the wavelength-shifting resin medium 3 as it is, while another part of the blue light is changed into the complementary color light due to the existence of the photofluorescent compound. And these colors are mixed together outside to produce non-colored light perceptible as white.

The radiation emitted from the LED 1 passes through the upper surface of the sapphire substrate 10. Accordingly, the current-diffusing transparent electrode 118, which is needed in the prior art LED 110, is no longer necessary for the p-side electrode 18 of the LED 1. The p-side electrode 18 is only required to be relatively thick for the current diffusion purposes.

Next, the overvoltage protective function of the composite light-emitting device according to the present invention will be described.

Dielectric breakdown happens in the prior art white LED lamp of GaN at a forward static voltage of about 100 V or at a reverse static voltage of about 30 V when electric discharge is caused between the lamp and a charged capacitor facing each other. These static voltages are much lower than those of a long-wavelength-oscillating LED made of any other bulk compound semiconductor such as GaP or GaAlAs. Thus, dielectric breakdown is far more likely to happen in such an LED lamp if no overvoltage protective function is provided therefor to prevent the external application of static electricity.

Figure 2:
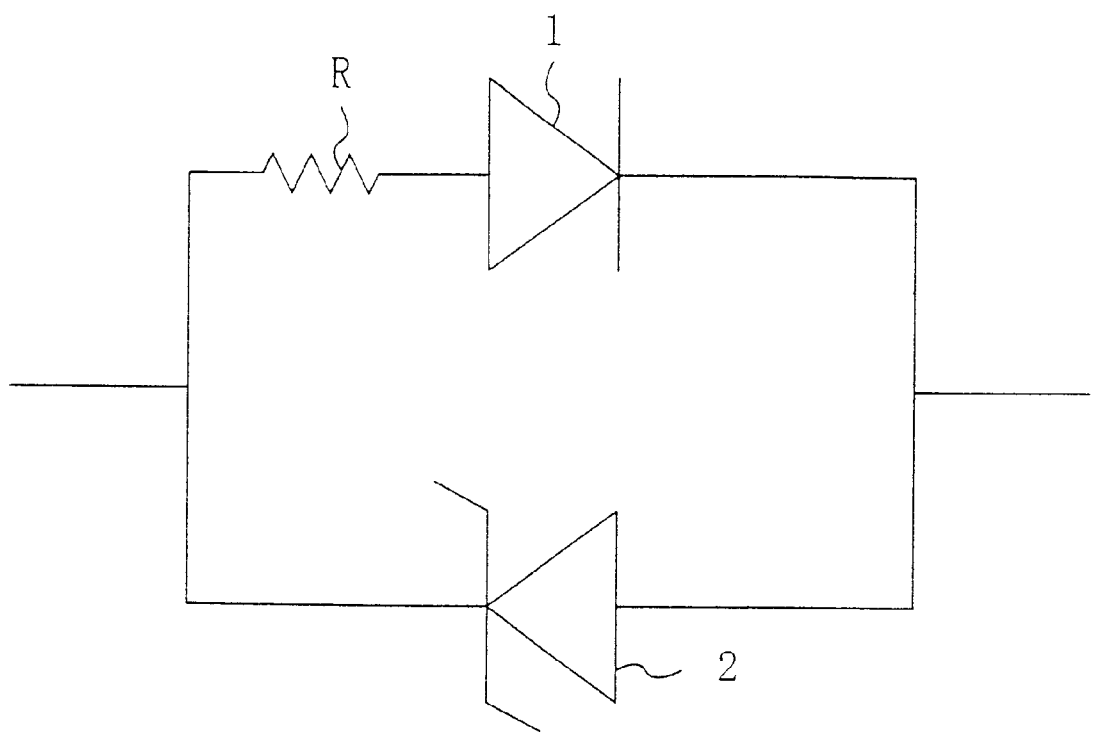
FIG. 2 is an equivalent circuit diagram illustrating a protective function of the composite light-emitting device according to the first embodiment.

As can be seen from FIG. 1(a), the diode 2 with the protective function and the LED 1 are connected in the reverse direction and in parallel to each other. FIG. 2 represents that connection as an equivalent circuit diagram. As shown in FIG. 2, the electrodes of mutually opposite polarities are connected together between the LED 1 and diode 2, thereby preventing an overvoltage from being applied to the LED 1 externally. That is to say, the negative electrode of the LED 1 is connected to the positive one of the diode 2 and vice versa. Also, a resistive component produced by the n-type substrate of the diode 2 is added in series to the positive electrode of the LED 1 so as to function as a protective resistor R although its resistance is very low.

In such a circuit configuration, if a reverse bias voltage is applied to the LED 1, then the voltage is forward-biased for the diode 2 functioning: as the overvoltage protector. That is to say, the current flows more easily through the diode 2, thus protecting the LED 1. Alternatively, if a forward bias voltage is applied to the LED 1, then the voltage is reverse-biased for the diode 2. That is to say, the current flows more easily through the LED 1 this time, thus emitting the radiation with much more certainty. In this manner, both the protective and radiative functions are attained just as intended.

In the illustrated embodiment, since the forward operating voltage of the diode 2 is about 0.9 V, the reverse bias voltage applied to the LED 1 is cut off at 0.9 V. Also, since the reverse breakdown voltage (i.e., Zener voltage) of the diode 2 can be set at around 10 V, the LED 1 can also be protected using the protective resistor R and the Zener voltage even when a forward bias voltage is applied thereto. The forward and reverse dielectric breakdown voltages of the LED 1 are about 100 V and about 30 V. Thus, such a configuration can prevent the LED 1 from being destroyed due to the application of an overvoltage due to static electricity, for example.

Suppose Vf1 and Vb1 represent the forward and reverse dielectric breakdown voltages of the LED 1, Vf2 and Vb2 represent the forward operating voltage and reverse breakdown voltage of the diode 2 and VF represents the operating voltage of the LED 1, respectively. According to this notation, the following inequalities should be met to avoid the destructive breakdown:

Vf2<Vb1

VF<Vb2<Vf1

Hereinafter, a detailed structure of the LED according to the first embodiment will be described with reference to the accompanying drawings.

Figure 3A:
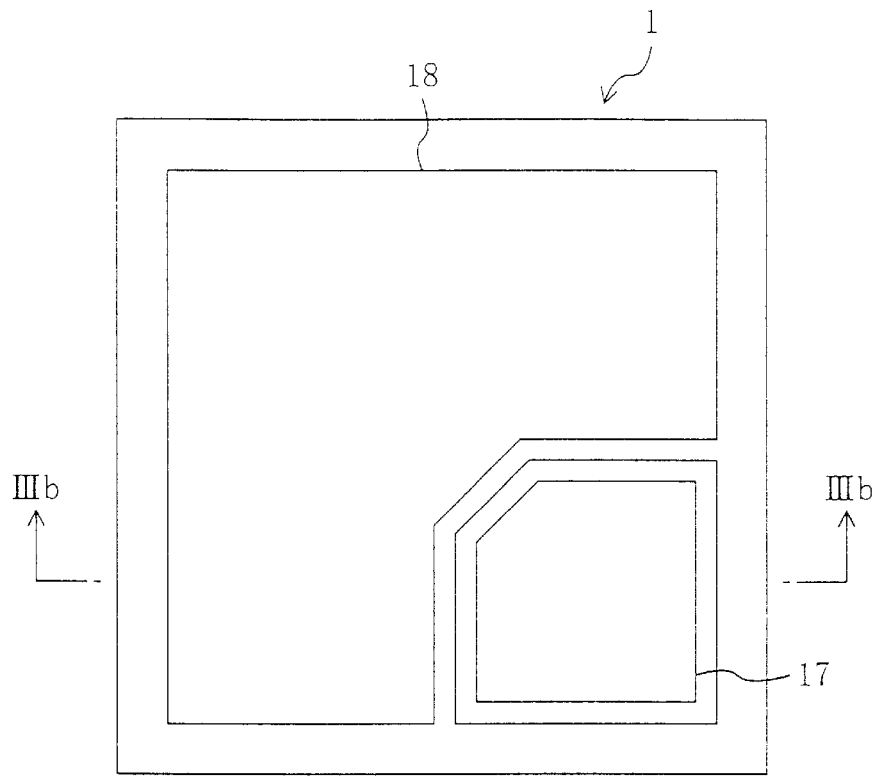
FIGS. 3(a) and 3(b) are respectively a plan view and cross-sectional view, which is taken along the line IIIb—IIIb in FIG. 3(a), illustrating a light-emitting diode according to the first embodiment.
Figure 3B:
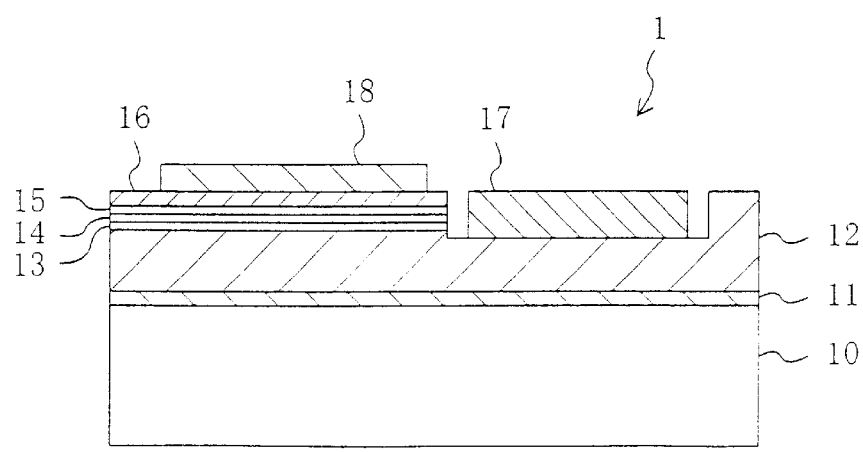

FIGS. 3(a) and 3(b) respectively illustrate a planar layout and a cross-section taken along the line IIIb—IIIb in FIG. 3(a) of the LED according to the first embodiment. As shown in FIG. 3(b), an AlN buffer layer 11 and an n-type GaN contact layer 12 are deposited in this order on a sapphire substrate 10. On part of the upper surface of the n-type contact layer 12, an n-type AlGaN first cladding layer 13, a multiple quantum well (MQW) structure 14, a p-type AlGaN second cladding layer 15 and a p-type GaN contact layer 16 are stacked in this order one upon the other. The MQW structure 14 is formed by stacking a multiplicity of quantum well layers, each consisting of an undoped InGaN well layer and an undoped GaN barrier layer.

As shown in FIG. 3(a), an n-side electrode 17 containing aluminum (Al) is formed on an exposed part of the upper surface of the n-type contact layer 12 at a corner. In addition, a p-side electrode 18 containing silver (Ag), titanium (Ti) and gold (Au) is formed on the p-type contact layer 16 without providing any current-diffusing transparent electrode thereon.

The LED 1 according to this embodiment is substantially square on its planar layout. Each side of the square is about 0.3 mm long. It should be noted that each side of the squared LED 1 should preferably be 0.18 mm or more. This is because it would be difficult to shape an LED with a size of less than 0.18 mm into a chip form and because the reliability of the light-emitting diode deteriorates in such a small size.

Next, a detailed structure of the diode 2 according to the first embodiment will be described with reference to the accompanying drawings.

Figure 4A:
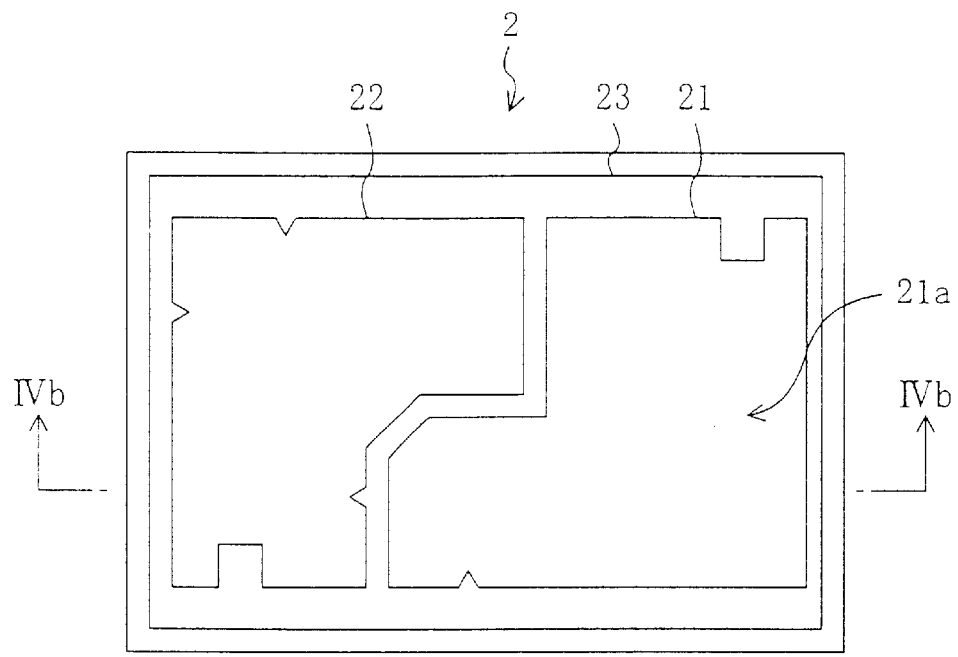
FIGS. 4(a) and 4(b) are respectively a plan view and cross-sectional view, which is taken along the line IVb—IVb in FIG. 4(a), illustrating a submount member according to the first embodiment.
Figure 4B:
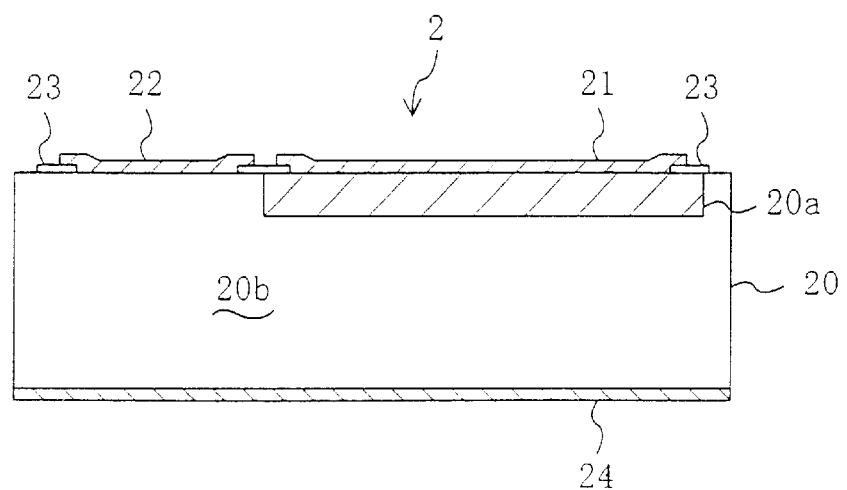

FIGS. 4(a) and 4(b) respectively illustrate a planar layout and a cross-section taken along the line IVb—IVb in FIG. 4(a) of the diode 2 functioning as a submount member according to the first embodiment. As shown in FIG. 4(b), the diode 2 includes the p-type semiconductor region 20a in the upper part of the n-type silicon body 20. The region 20a has been doped with p-type dopant ions such as boron ions to set the reverse breakdown voltage at around 10 V.

On the upper surface of the body 20, the p-side counter electrode 21 of Al is formed over, and connected to, the p-type semiconductor region 20a, and the n-side counter electrode 22 of Al is formed over the n-type semiconductor region 20b. The n-side counter electrode 22 is connected to the n-type semiconductor region 20b but is separated from the p-side counter electrode 21 via the insulating film 23. On the back surface of the body 20 on the opposite side to the upper surface thereof where the counter electrodes are located, the backside electrode 24 containing antimony (Sb), nickel (Ni) or gold (Au) is formed. The backside electrode 24 may be electrically connected to an external lead, for example.

In the illustrated embodiment, the size of the diode 2 is about 0.4 mm by about 0.6 mm in its planar layout. It should be noted that each side of the rectangular diode 2 as the submount member is preferably about 0.25 mm or more. This is because the diode 2 of such a size can function as a support (or receptacle) for the wavelength-shifting resin medium 3 most suitably. More preferably, when the LED 1 is about 0.28 mm×about 0.28 mm square, the diode 2 should be in the shape of a rectangle, at least one side of which is equal to or longer than the diagonal of the square, i.e., 0.40 mm or more.

The light-emitting device according to this embodiment includes the submount member 2 for supporting the LED 1 and wavelength-shifting resin member 3 thereon. Thus, a highly reliable light-emitting device with a protective function against an overvoltage due to static electricity can be obtained with the LED 1 always covered with the wavelength-shifting resin member 3, no matter whether the reflective cup is provided or how the mount of the casing is shaped.

Another feature of this embodiment is that the LED 1 is flip-chip bonded onto the principal surface of the diode 2 via the microbumps 25. In other words, a relatively wide bonding pad region, which is needed for electrically connecting the LED 1 to the diode 2 using wires, is not necessary. Thus, the composite light-emitting device of a size smaller than ordinary ones can be obtained. Moreover, the area of the n-side electrode 17, which does not contribute to the emission of radiation from the LED 1, can be relatively small as shown in FIG. 3(a). Accordingly, the chip can be downsized without cutting down the desired emission area.

Furthermore, the LED substrate 10 is made of transparent sapphire and the emission is allowed to pass through the substrate side. Thus, compared to the prior art LED 110 where the emission is supposed to pass through its circuitry side, a higher luminous efficiency is attainable because the emission is not blocked by the electrodes. Accordingly, by adopting the flip-chip bonding technique using the microbumps 25, the chip area of the composite light-emitting device, which is made of relatively expensive compound semiconductors, can be reduced. As a result, a higher luminous efficiency is attainable at a reduced cost.

Figure 14:
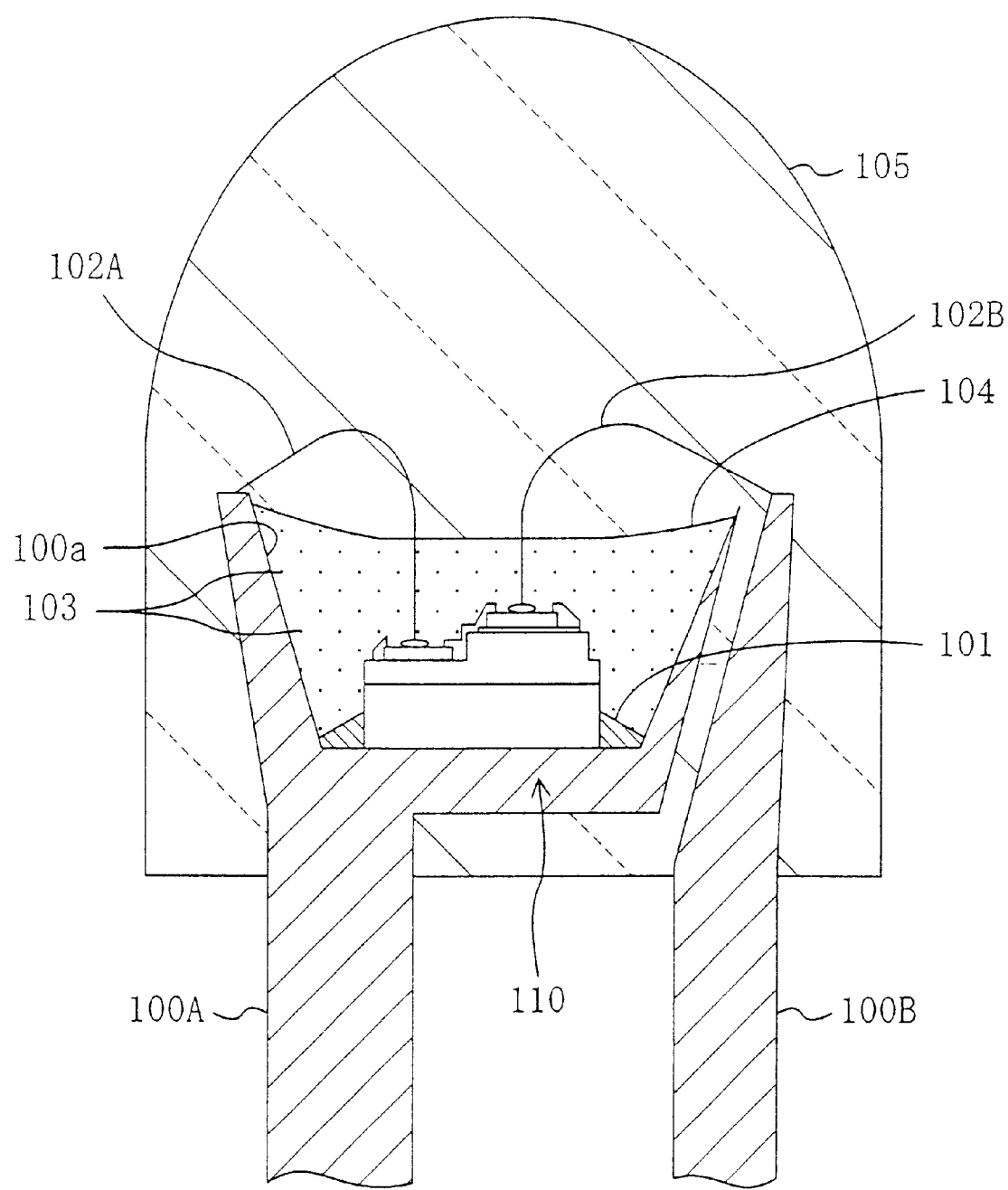
FIG. 14 is a cross-sectional view illustrating a prior art white LED lamp.
Figure 15A:
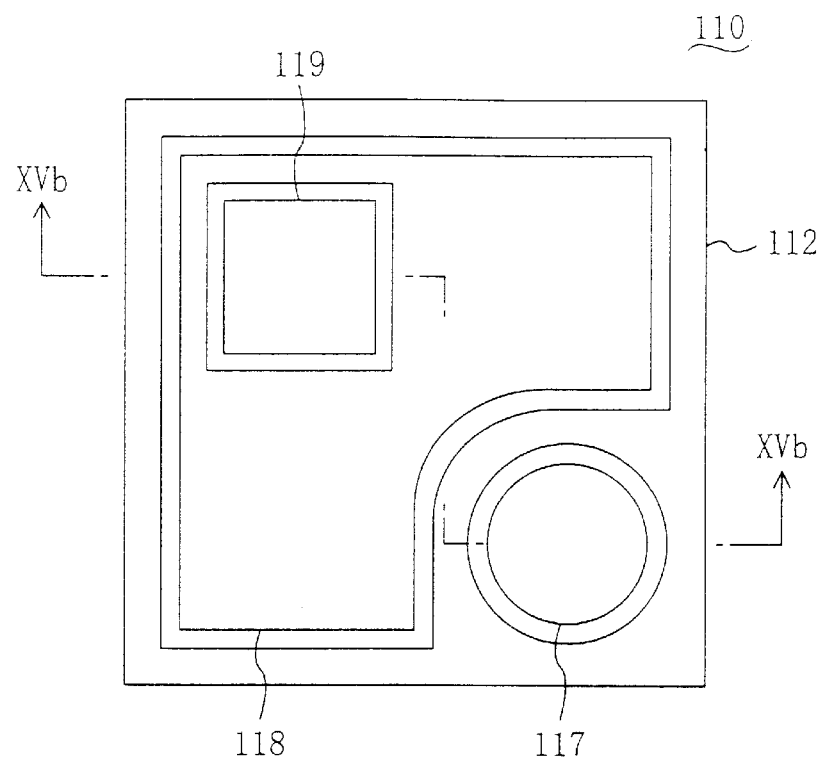
FIGS. 15(a) and 15(b) are respectively a plan view and cross-sectional view,. which is taken along the line XVb—XVb in FIG. 15(a), illustrating a prior art light-emitting diode.
Figure 15B:
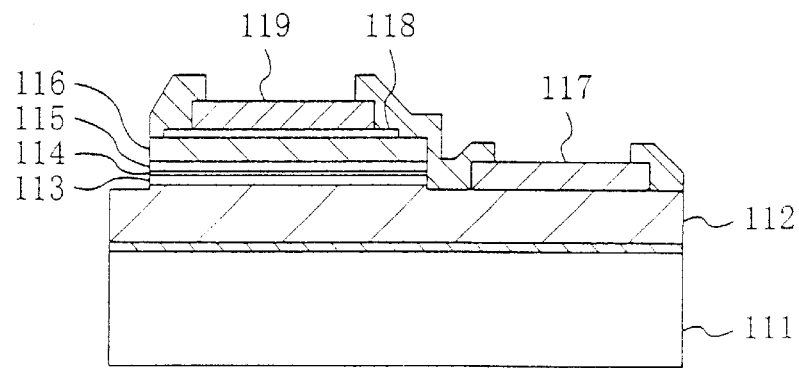

Furthermore, the device can dissipate heat more efficiently. In the prior art LED lamp shown in FIG. 14, the heat generated from the LED 110 is radiated through the wavelength-shifting resin member 104, first and second Au wires 102A, 102B and sapphire substrate. However, the thermal conductivities of the wavelength-shifting resin member 104 and sapphire substrate are low. Likewise, although the thermal conductivity of the wires 102A and 102B is high, these wires cannot dissipate heat satisfactorily, because the diameter thereof (in the range from 25 to 30 μm) is much smaller than the size of the LED 110. Also, since these wires 102A, 102B are far longer than the LED 110, the heat must be transmitted over a much longer distance. Thus, the heat generated during the operation of the lamp is unintentionally stored in the wavelength-shifting resin member 104, thereby getting the wavelength-shifting resin member 104 and surrounding portions thereof discolored. As a result, the luminous efficiency and the brightness of the lamp both decrease.

In contrast, according to this embodiment, the heat generated from the LED 1 is dissipated to an external member through the n- and p-side electrodes 17, 18, the microbumps 25 with a diameter of about 100 μm and a height of about 15 μm and then the Si diode 2 with a thermal conductivity high enough to be usable as a heat sink. Thus, the device of this embodiment can dissipate the heat very efficiently, and therefore the discoloration of the wavelength-shifting resin member 3, which usually decreases the brightness, is avoidable. As a result, such a device ensures long-term reliability.

In the foregoing embodiment, the lateral diode 2 is used as an exemplary overvoltage protector. Alternatively, any of various other diodes including vertical pn diode, pin diode, Schottky-barrier diode, Zener diode, tunnel diode and gunn diode is also applicable.

Optionally, a gunn diode utilizing the gunn effect of compound semiconductors may be formed on the substrate 10 of the LED 1.

Furthermore, a field effect transistor with its threshold voltage set higher than the operating voltage of the light-emitting diode but lower than the forward and reverse dielectric breakdown voltages thereof may also be provided as the overvoltage protector.

Modified Example of Embodiment 1

Hereinafter, a modified example of the first embodiment will be described with reference to the accompanying drawings.

Figure 5:
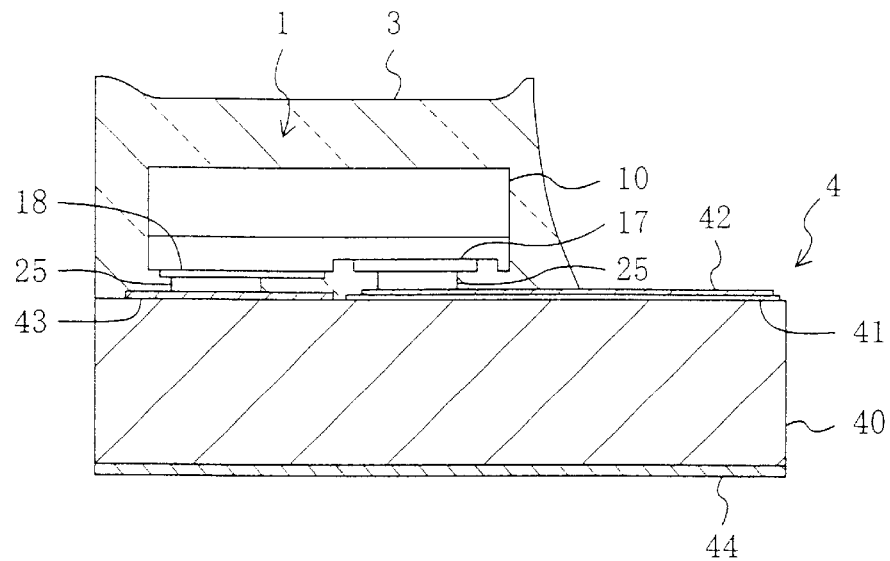
FIG. 5 is a cross-sectional view illustrating a composite light-emitting device according to a modified example of the first embodiment.
Figure 6:
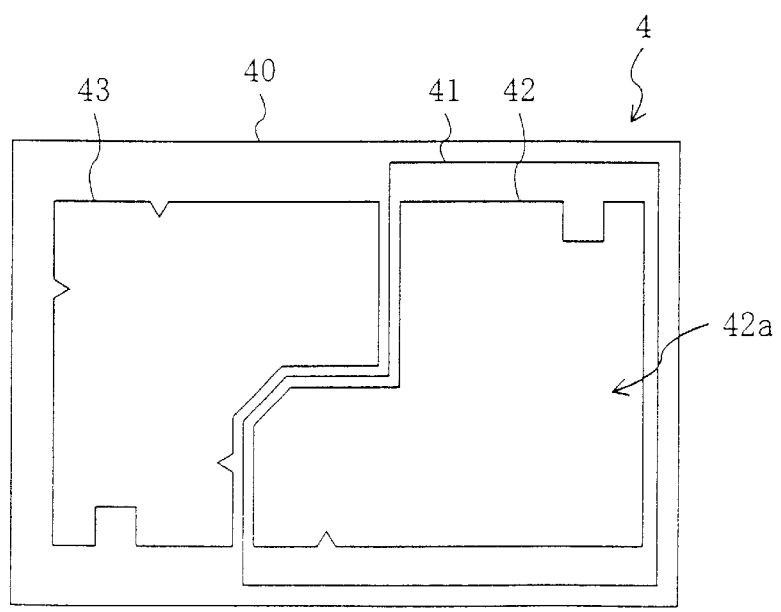
FIG. 6 is a plan view illustrating a submount member according to the modified example of the first embodiment.

FIG. 5 illustrates a cross-sectional structure of a composite light-emitting device according to a modified example of the first embodiment. FIG. 6 illustrates a planar layout of an auxiliary member implemented as a submount member according to this modified example. In FIG. 5, the same members as those illustrated in FIG. 1(a) will be identified by the same reference numerals and the description thereof will be omitted herein.

In this modified example, the LED 1 is supported over the auxiliary member 4 with no protective function, not the diode 2 as a submount member for the LED 1, with the microbumps 25 interposed therebetween as shown in FIG. 5. For example, if the LED substrate 10 is made of transparent silicon carbide (SiC) instead of sapphire, then the auxiliary member 4 with a simple configuration is applicable, because the LED with such a substrate is highly resistant to static electricity.

As shown in FIG. 6, the auxiliary member 4 includes first and second counter electrodes 42 and 43 over the principal surface of a substrate 40 made of conductive silicon. The first counter electrode 42 is formed over, and electrically isolated from, the substrate 40 with an insulating film 41 of silicon dioxide, for example, interposed therebetween. On the other hand, the second counter electrode 43 is electrically continuous with the substrate 40. As in the first embodiment, the exposed part of the first counter electrode 42 serves as a bonding pad 42a. In addition, a backside electrode 44 is formed on another surface of the substrate 40 on the opposite side to its principal surface and is electrically continuous with the second counter electrode 43.

As can be seen from FIG. 5, the first counter electrode 42 faces and is connected to the n-side electrode 17 of the LED 1, while the second counter electrode 43 faces and is connected to the p-side electrode 18 of the LED 1. In this modified example, the size of the auxiliary member 4 is about 0.4 mm by about 0.6 mm in its planar layout. It should be noted that since the substrate 40 has no polarity, the electrodes 17 and 18 may be connected to the counter electrodes 43 and 42, respectively.

Since the composite light-emitting device according to this modified example is provided with the auxiliary member 4 including the conductive substrate 40, the following effects are attainable.

Specifically, the submount member is provided for supporting the LED 1 and wavelength-shifting resin member 3, which are indispensable for a composite light-emitting device. Thus, the composite light-emitting device can be mounted onto a semiconductor light-emitting unit easily and just as intended irrespective of the shape of the mount provided for the light-emitting unit.

In addition, the LED 1 is flip-chip bonded onto the principal surface of the auxiliary member 4, which functions as the submount member, via the microbumps 25. Thus, the composite light-emitting device of a size smaller than ordinary ones can be obtained. Furthermore, the emission of the LED 1 is allowed to pass through the transparent substrate 10. Thus, a higher luminous efficiency is attainable while cutting down the chip cost. Furthermore, the heat generated from the LED 1 can be dissipated very efficiency through the auxiliary member 4 to an external member, thus preventing a decrease in brightness.

In the first embodiment and its modified example, the Group III nitride LED 1 is used as an exemplary light-emitting element. Alternatively, a surface-emitting laser diode is also applicable. Or the composite light-emitting device may include a longer-wavelength-oscillating light-emitting diode or laser diode containing a Group III arsenide such as GaAs.

Embodiment 2

Hereinafter, a second exemplary embodiment of the present invention will be described with reference to the accompanying drawings.

Figure 7A:
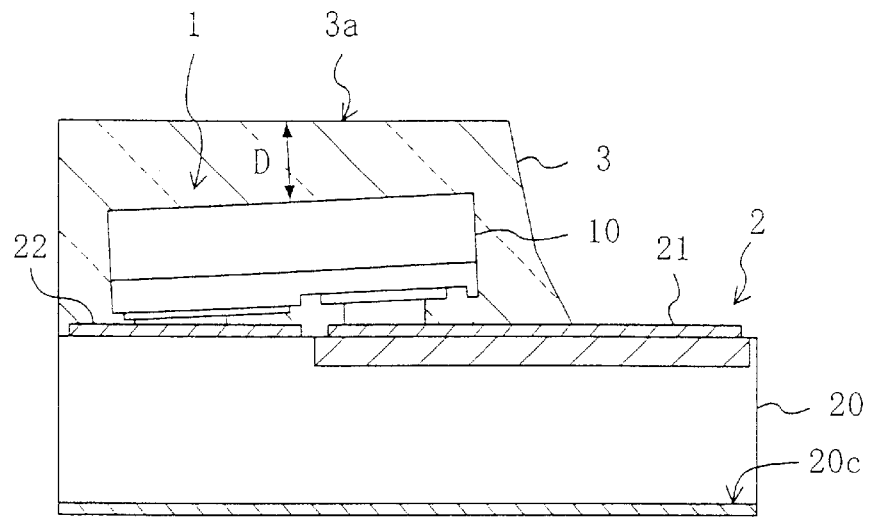
FIGS. 7(a) and 7(b) are cross-sectional views illustrating two exemplary composite light-emitting devices according to a second embodiment of the present invention.
Figure 7B:
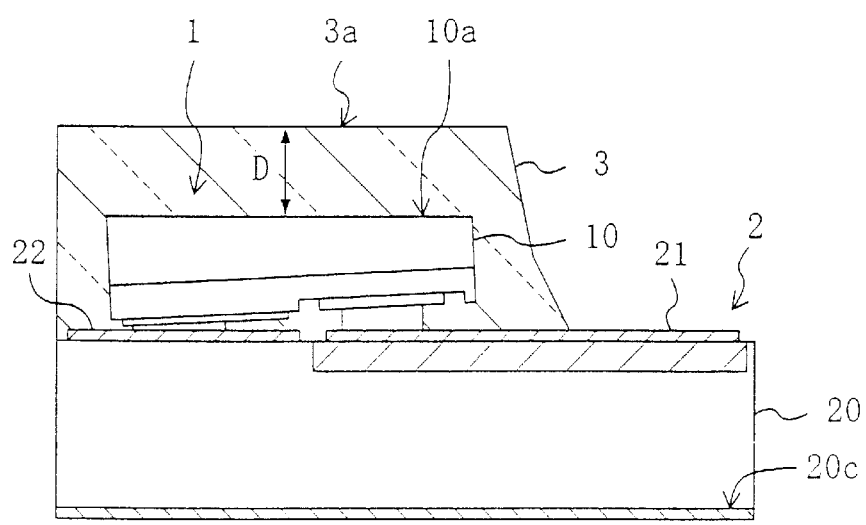

FIGS. 7(a) and 7(b) illustrate cross-sectional structures of two exemplary composite light-emitting devices according to the second embodiment. In FIGS. 7(a) and 7(b), the same members as those of the composite light-emitting device according to the first embodiment illustrated in FIG. 1(a) will be identified by the same reference numerals. In the device shown in FIG. 7(a), a surface 20c of the diode 2 as a submount member, which is opposite to another surface thereof facing the LED 1, i.e., the surface on which the backside electrode is formed, is substantially parallel to the upper surface 3a of the wavelength-shifting resin member 3. In the device shown in FIG. 7(b) on the other hand, the back surface 20c of the diode 2, the upper surface 10a of the LED substrate 10 and the upper surface 3a of the wavelength-shifting resin member 3 are all substantially parallel to each other. According to the second embodiment, the chromaticity of the white light passing through the wavelength-shifting resin member 3 is adjustable and the variation in chromaticity is suppressible. As the submount member, the diode 2 may be replaced with the auxiliary member 4 shown in FIG. 5.

As described above, the white emission is obtained as a mixture of the blue light that has passed through the wavelength-shifting resin member 3 as it is and the light that has been changed into the complementary color light due to the existence of the photofluorescent compound in the resin member 3. Accordingly, the chromaticity of the white emission is determined primarily by the content of the photofluorescent compound and the thickness D of an upper part of the wavelength-shifting resin member 3.

The present inventors analyzed the dependence of chromaticity coordinates (x, y) on the content of the photofluorescent compound in the wavelength-shifting resin member 3 and on the thickness D using an LED 1 emitting blue light with a dominant wavelength of approximately 465 to 470 nm. The following Table 1 illustrates the results of this analysis:

TABLE 1

|  | 10 μm | 20 μm | 50 μm | 100 μm | 110 μm | 120 μ |
|---|---|---|---|---|---|---|
| 30 wt % | x 0.19 | x 0.22 | x 0.23 | x 0.23 | x 0.24 | x 0.24 |
|  | y 0.24 | y 0.27 | y 0.28 | y 0.28 | y 0.29 | y 0.29 |
| 50 wt % | x 0.20 | x 0.25 | x 0.28 | x 0.30 | x 0.30 | x 0.36 |
|  | y 0.25 | y 0.30 | y 0.33 | y 0.35 | y 0.35 | y 0.41 |
| 90 wt % | x 0.24 | x 0.30 | x 0.32 | x 0.33 | x 0.35 | x 0.37 |
|  | y 0.29 | y 0.35 | y 0.37 | y 0.38 | y 0.40 | y 0.42 |

In Table, the content of the photofluorescent compound is represented in percentages by weight and the thickness D is shown by micrometers. In this case, an epoxy resin compound was used as the transparent resin and $(Y, Gd)_x(Al, Ga)_5O_{12}$; Ce was used as the photofluorescent compound.

As can be seen from Table 1, when the thickness D of the wavelength-shifting resin member 3 is in the range from 20 μm to 110 μm and the content of the photofluorescent compound is in the range from 50 to 90 wt %, emission with a chromaticity approximate to that of white light (where x=0.25 to 0.40 and y=0.25 to 0.40) can be obtained as indicated by the double line. Also, to obtain white light with chromaticity coordinates (x, y)=(0.28, 0.33) using a wavelength-shifting resin member 3 in which the photofluorescent compound is contained at 50 wt %, the thickness D of the upper part of the wave length-shifting resin member 3 should be about 50 μm.

The wavelength-shifting resin member 3 can be precisely provided on the upper surface 10a of the LED substrate 10 at a uniform thickness of about 50 μm in the following manner. Specifically, the LED 1 may be bonded onto the diode 2 include in a wafer such that the upper surface 10a of the LED substrate 10 becomes parallel-to the back surface 20c of the diode 2. Then, the upper surface 10a of the LED substrate 10 may be coated with the wavelength-shifting resin medium 3 to the thickness of about 50 μm by a screen printing technique, for example, such that the upper surface of the medium 3 becomes parallel to the upper surface 10a of the LED substrate 10. In this case, the upper surface of the diode 2 could be a reference plane. However, the back surface 20c is preferred, because there is some unevenness on the upper surface of the diode 2 due to the existence of the electrodes 21 and 22.

The thickness D of that part of the wavelength-shifting resin member 3 above the substrate 10 may also be uniformized by coating the upper surface 10a with relatively thick wavelength-shifting resin medium 3 and then polishing and parallelizing the surface of the medium 3 with respect to the reference plane. In such a case, the chromaticity is adjustable to an arbitrary value and the variation in thickness D of that part can be minimized among the diodes 2 on the wafer.

In this case, if the upper surface 10a of the LED substrate 10 is antiparallel to the reference plane 20c as shown in FIG. 7(a), then the thickness D defined between the center of the upper surface 10a of the LED substrate 10 and the upper surface 3a of the wavelength-shifting resin member 3 may be set at the predetermined value of 50 μm. Then, after the LED 1 has been bonded onto the diode 2 on the wafer, the upper surface 10a of the LED substrate 10 may be polished to be parallel to the reference plane 20c as shown in FIG. 7(b).

According to this embodiment, the upper surface 10a of the LED substrate 10 and/or the upper surface 3a of the wavelength-shifting resin member 3 provided on the substrate 10 are/is substantially parallel to the back surface 20c of the diode 2 as a reference plane. Thus, the chromaticity of white light is adjustable and the variation thereof is suppressible.

It is noted that the thickness of another part of the wavelength-shifting resin member 3 covering the sides of the LED 1 should also be substantially uniform. The thickness is preferably in the range from 20 μm to 110 μm, both inclusive. In such a case, not only that part of the wavelength-shifting resin member 3 above the upper surface 10a of the LED substrate 10 but also another part thereof surrounding the LED 1 can have their thicknesses optimized. As a result, good white emission can be obtained without causing any color unevenness.

Embodiment 3

Hereinafter, a third exemplary embodiment of the present invention will be described with reference to the accompanying drawings.

Figure 8:
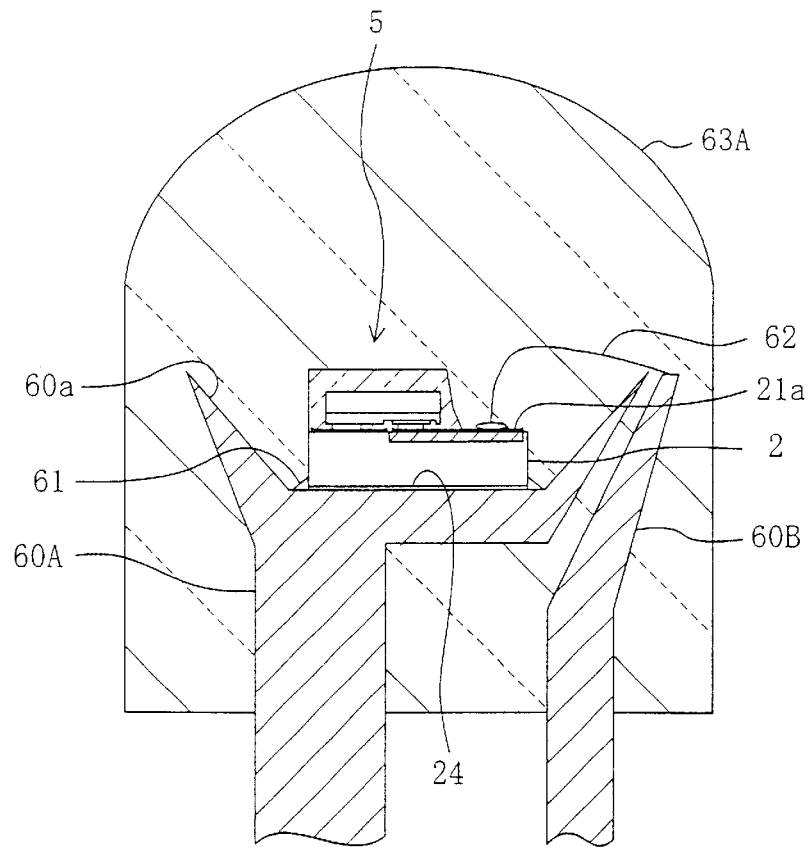
FIG. 8 is a cross-sectional view illustrating a semiconductor conductor light-emitting unit according to a third embodiment of the present invention.

FIG. 8 illustrates a cross-sectional structure of a semiconductor light-emitting unit according to the third embodiment, or a white LED lamp including the composite light-emitting device of the present invention. As shown in FIG. 8, the white LED lamp according to the third embodiment includes first and second leadframes 60A and 60B. A reflective cup 60a with an opening at the top is provided for the first leadframe 60A at one end thereof. The top of the second leadframe 60B is spaced apart from the reflective cup 60a. The composite light-emitting device 5 according to the first embodiment is bonded and electrically connected onto a die pad at the bottom of the reflective cup 60a with silver (Ag)-containing paste 61 interposed between the backside electrode 24 of the diode 2 and the die pad.

The bonding pad 21a of the p-side counter electrode in the diode 2 of the composite light-emitting device 5 is electrically connected to the second leadframe 60B with a gold (Au) wire 62.

The ends of the first and second leadframes 60A and 60B, as well as the reflective cup 60a, are molded together within a resin encapsulant 63A, e.g., transparent epoxy resin. The upper half of the resin encapsulant 63A is molded in a hemi-spherical shape.

Modified Example of Embodiment 3

Hereinafter, a modified example of the third embodiment will be described with reference to the accompanying drawings.

Figure 9:
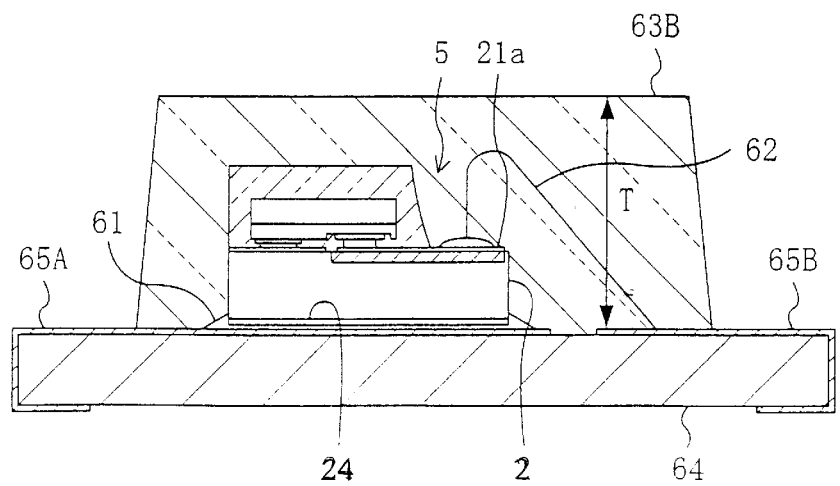
FIG. 9 is a cross-sectional view illustrating a semiconductor light-emitting unit according to a modified example of the third embodiment.

FIG. 9 illustrates a cross-sectional structure of a semiconductor light-emitting unit according to a modified example of the third embodiment, or a chip LED lamp including the composite light-emitting device of the present invention. As shown in FIG. 9, the chip LED lamp according to this modified example includes an insulating wiring board 64 and the composite light-emitting device 5. On the surface of the wiring board 64, first and second interconnection lines 65A and 65B are formed selectively. The composite light-emitting device 5 is bonded and electrically connected onto a die pad of the first interconnection line 65A on the wiring board 64 with the Ag-containing paste 61 interposed between the backside electrode 24 of the diode 2 and the die pad.

The bonding pad 21a of the p-side counter electrode in the diode 2 of the composite light-emitting device 5 is electrically connected to the second interconnection line 65B with the gold (Au) wire 62.

A bonding region on the wiring board 64, covering the composite light-emitting device 5, wire 62 and surrounding regions thereof, are molded together within a resin encapsulant 63B, e.g., transparent epoxy resin. The upper and side faces of the resin encapsulant 63B are planarized.

Compared to the LED lamp including the hemispherical resin encapsulant 63A, the thickness T of the resin encapsulant 63B for the chip LED lamp, which is defined between the mount of the wiring board 64 and the upper surface of the resin encapsulant 63B, can be reduced. Since the LED lamp is thinned, the mount volume can also be smaller, thus advantageously contributing to downsizing of light-emitting units.

Also, the light-emitting unit including the composite light-emitting device 5 of the present invention is even thinner in size than the prior art chip LED lamp including a receptacle in its casing and filling in the receptacle with the wavelength-shifting resin medium.

As described above, the semiconductor light-emitting units according to the third embodiment and its modified example are applicable no matter whether or not the mount is provided or how the mount is shaped in a supporting member like the reflective cup 60a or the casing receptacle for the composite light-emitting device. In addition, since the diode 2 is provided as the submount member, overvoltage protective function is also attainable by the submount member.

In the third embodiment and its modified example, the auxiliary member 4 shown in FIG. 5 may substitute as an alternative submount member for the diode 2.

Embodiment 4

Hereinafter, a fourth exemplary embodiment of the present invention will be described with reference to the accompanying drawings.

FIGS. 10(a) through 11(b) illustrate cross-sectional structures corresponding to respective process. steps for fabricating a semiconductor light-emitting unit according to the fourth embodiment. The light-emitting unit also includes the composite light-emitting device of the present invention.

Figure 10A:
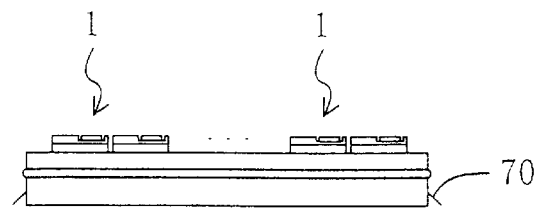
FIGS. 10(a) through 11(b) are cross-sectional views illustrating respective process steps for fabricating a semiconductor light-emitting unit according to a fourth embodiment of the present invention.

First, in the process step shown in FIG. 10(a), a number of LED's 1 shown in FIG. 3(a) are fabricated. Each of the LED's 1 is fabricated in the following manner. First, an AlN buffer layer 11 and an n-type GaN contact layer 12 are deposited by an MOVPE process, for example, in this order on a sapphire wafer. Next, an n-type AlGaN first cladding layer 13, an MQW structure 14, a p-type AlGaN second cladding layer 15 and a p-type GaN contact layer 16 are stacked in this order on the n-type contact layer 12. The MQW structure 14 is formed by stacking a multiplicity of quantum well layers, each consisting of an InGaN well layer and a GaN barrier layer. Then, parts of the n-type contact layer 12 are selectively exposed by photolithography and dry etching techniques and n-side electrodes 17 containing aluminum (Al) are formed by an evaporation technique on the exposed parts of the n-type contact layer 12. Also, p-side electrodes 18 containing silver (Ag), titanium (Ti) and gold (Au) are formed on the p-type contact layer 16. Then, the backside of the wafer, which is opposite to its circuitry side, is attached to an adhesive sheet 70 and the wafer is diced into multiple chips, thereby obtaining a plurality of LED's 1. Thereafter, the adhesive sheet 70 is. stretched with appropriate tension applied thereto, thereby increasing the space between adjacent ones of the chips. This is done to. get each chip easily adhered to, and then held (picked up) by, a jig in a subsequent bonding process step.

Figure 10B:
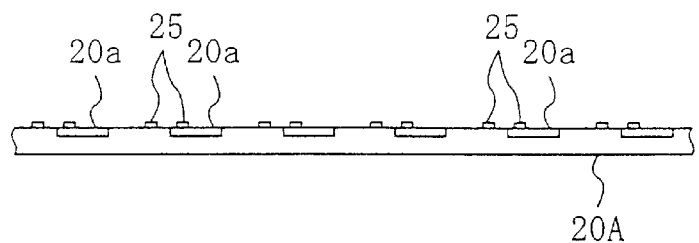

In parallel with the process step of making the LED's 1, diodes 2 are fabricated and the microbump 25 are formed on the diodes 2 as shown in FIG. 10(b). Specifically, multiple p-type semiconductor regions 20a are defined in columns and rows by an ion implantation technique within an n-type silicon wafer 20A. Next, the p- and n-side counter electrodes 21 and 22 of aluminum are formed by an evaporation technique, for example, on the principal surface of the wafer 20A. At the same time, the backside electrode 24 containing Sb, Ni or Au is formed on the other surface of the wafer 20A opposite to the principal surface. Thereafter, the microbumps 25 are formed by a stud bump forming technique on the p- and n-side counter electrodes 21 and 22 on the wafer 20A.

Figure 10C:
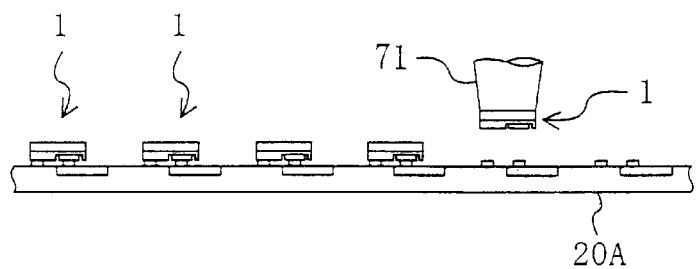

Then, in the process step shown in FIG. 10(c), the LED's 1 are placed over the diodes 2 such that the circuitry side of each of these LED's 1 faces the principal surface of the wafer 20A. In this case, the backside of each LED substrate 10, which is opposite to its circuitry side, is held by a bonder 71. Then, the n- and p-side electrodes 17, 18 of each LED 1 are aligned with the p- and n-side counter electrodes 21, 22 of the associated diode 2 and these electrodes are brought into contact with the microbumps 25. Next, the microbumps 25 are fused with heat, ultrasonic waves and load applied thereto, thereby bonding and electrically connecting the corresponding electrodes of the LED's 1 and diodes 2 together. In this case, the tact (or cycle) time of this chip bonding process step, which includes recognition, transportation, alignment and bonding of the LED's 1, can be about 3 seconds or less in total. The alignment accuracy should be about 15 $\mu$m or less. As a result of this chip bonding process step, a gap of about 15 $\mu$m is formed between the LED's 1 and the diodes 2. Accordingly, almost no shortcircuit failure happens between them.

Figure 10D:
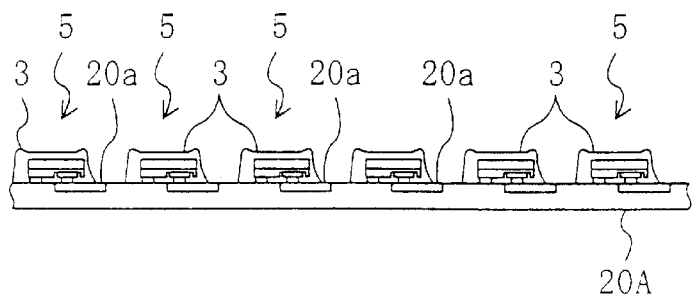

Next, in the process step shown in FIG. 10(d), the principal surface of the wafer 20A is coated with a wavelength-shifting resin medium 3 containing a photofluorescent compound to cover the LED's 1 and to leave bonding pad areas over the p-type semiconductor regions 20a. In this manner, multiple composite light-emitting devices 5 are completed. In this process step, a patternable method like screen printing is preferably adopted so as not to contaminate the bonding pads of the diodes 2 with the wavelength-shifting resin medium 3 as described above.

Figure 11A:
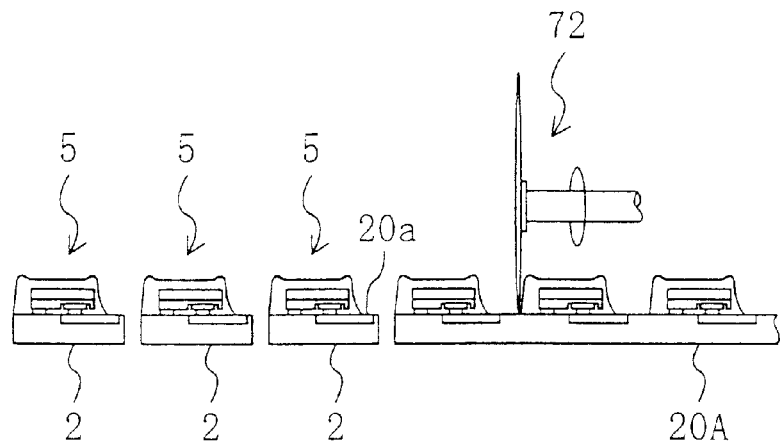

Subsequently, in the process step shown in FIG. 11(a), the wafer 20A is attached to an adhesive sheet (not shown) and then diced into a plurality of chips, corresponding to respective composite light-emitting devices 5 including the diode 2, using a dicer 72.

Figure 11B:
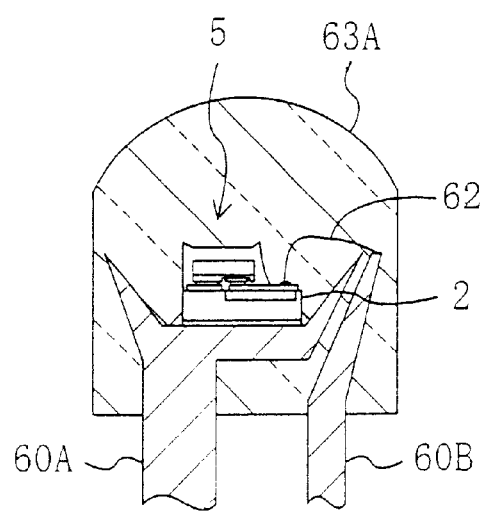

Then, in the process step shown in FIG. 11(b), each composite light-emitting device 5 is bonded and electrically connected to the first leadframe 60A with conductive paste interposed between the die pad of the first leadframe 60A and the backside electrode 24 of the diode 2. Thereafter, the bonding pad of the p-side counter electrode 21 in the diode 2 of the composite light-emitting device 5 is electrically connected to the second leadframe 60B with the wire 62. Finally, the ends of the first and second leadframes 60A and 60B, as well as the composite light-emitting device 5, are molded together within the transparent epoxy resin encapsulant 63A.

As can be seen, according to the present invention, the composite light-emitting device 5 itself includes a submount member (i.e., the diode 2) for supporting the wavelength-shifting resin member 3 thereon. Thus, a white-light-emitting unit with overvoltage protective function can be obtained without depending on the shape of the supporting member on which the composite light-emitting device 5 is mounted.

Also, a chip LED may be formed by replacing the first and second leadframes 60A and 60B with the insulating wiring board 64 as shown in FIG. 9. As the submount member for the LED 1, the auxiliary member 4 may be used instead of the diode 2.

The microbumps 25 may be formed on the p- and n-side electrodes of the LED 1.

In the foregoing embodiment, the stud bumps 25 are used as the microbumps. Alternatively, plated bumps may be formed by a plating technique. In such a case, the diameter of each microbump can be reduced, thus downsizing the LED 1 and cutting down the fabrication cost thereof. In addition, compared to forming the stud bumps, the plated bumps can be formed at far more accurate positions. As a result, the assembly yield can be improved.

The LED 1 may be replaced with a laser diode as an alternative light-emitting element. Also, the light-emitting element does not have to emit blue light using GaN.

Embodiment 5

Hereinafter, a fifth exemplary embodiment of the present invention will be described with reference to the accompanying drawings.

FIGS. 12(a) through 13(c) illustrate cross-sectional structures corresponding to respective process steps for fabricating a semiconductor light-emitting unit according to the fifth embodiment. The semiconductor light-emitting unit also includes the composite light-emitting device of the present invention.

According to the method of the fifth embodiment, not only all the process steps of the fourth embodiment, but also an additional process step of uniformizing the thickness of the wavelength-shifting resin member 3 to adjust the chromaticity of white light and thereby suppress its variation are carried out.

Figure 12A:
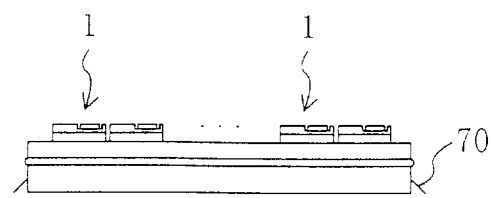
FIGS. 12(a) through 13(c) are cross-sectional views illustrating respective process steps for fabricating a semiconductor light-emitting unit according to a fifth embodiment of the present invention.

First, in the process step shown in FIG. 12(a), multiple LED's 1 are made in the form of chips as in the fourth embodiment.

Figure 12B:
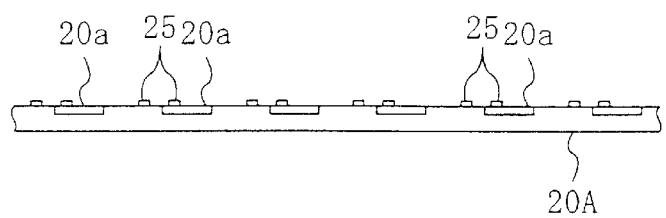

Next, in the process step shown in FIG. 12(b), multiple p-type semiconductor regions 20a are defined within an n-type silicon wafer 20A. Then, the p- and n-side counter electrodes 21 and 22 are formed on the principal surface of the wafer 20A. Subsequently, the backside electrode 24 is formed on the other surface of the wafer 20A opposite to the principal surface. Thereafter, the microbumps 25 are formed by a stud bump forming or plating technique on the p- and n-side counter electrodes 21 and 22 on the wafer 20A.

Figure 12C:
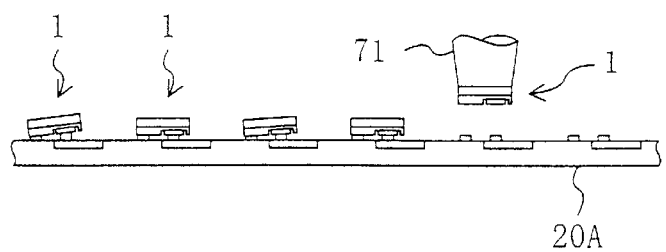

Then, in the process step shown in FIG. 12(c), the n- and p-side electrodes 17, 18 of each LED 1 are aligned with the p- and n-side counter electrodes 21, 22 of the associated diode 2 using the bonder 71 and these electrodes are brought into contact with the microbumps 25. Next, the microbumps 25 are fused, thereby bonding the corresponding electrodes of the LED's 1 and diodes 2 together and electrically and mechanically connecting the LED's 1 and diodes 2 together. Generally speaking, in a chip bonding process step, it is very difficult to bond the LED chip 1 to the diode 2 such that the upper surface of the sapphire substrate for the LED 1, through which the emission passes, becomes parallel to the back surface of the wafer on which the backside electrode is formed.

Figure 12D:
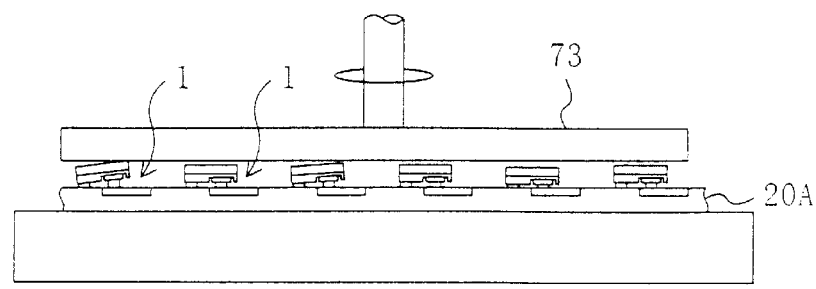

Thus, in the process step shown in FIG. 12(d), the respective upper surfaces of the LED substrates 10 are polished using a polisher 73 such that the upper surface of each substrate 10 becomes substantially parallel to the back surface of the wafer 20A. In this process step, the gap between the wafer 20A and the LED's 1 should preferably be filled in with a photoresist resin, for example, to prevent the LED's 1 from being detached from the wafer 20A due to the friction caused between the LED's 1 and the polishing slurry.

Figure 13A:
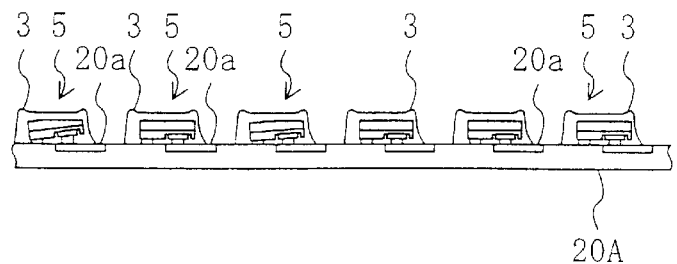

Subsequently, in the process step shown in FIG. 13(a), the principal surface of the wafer 20A is coated by a screen printing technique with a wavelength-shifting resin medium 3 to cover the LED's 1 and to leave bonding pad areas over the p-type semiconductor regions 20a. In this manner, multiple composite light-emitting devices 5 are completed.

Figure 13B:
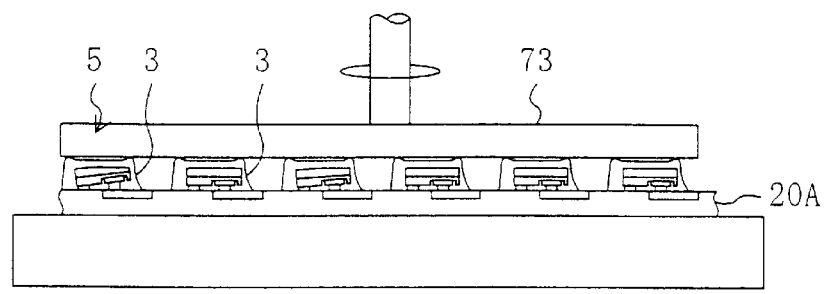

Next, in the process step shown in FIG. 13(b), the upper surface of each wavelength-shifting resin members 3 is polished to a predetermined thickness using the polisher 73 again so as to be substantially parallel to the backside of the wafer 20A.

Figure 13C:
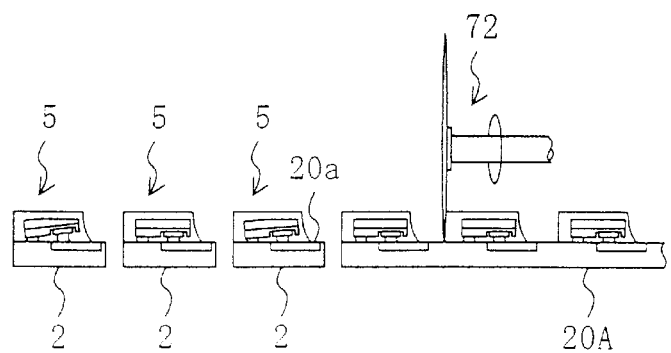

Then, in the process step shown in FIG. 13(c), the wafer 20A is diced into a plurality of chips, corresponding to respective composite light-emitting devices 5 including the diode 2, using the dicer 72. In this process step, each resin member 3 is also partially cut away such that part of the wavelength-shifting resin member 3 covering the sides of the LED 1 has a substantially uniform predetermined thickness.

Finally, although not shown, each of the composite light-emitting devices 5 obtained is mounted onto a leadframe or wiring board, and then molded within a resin encapsulant, thereby completing a semiconductor light-emitting unit.

The method according to the fifth embodiment can attain the same effects as those attainable by the method of the fourth embodiment. In addition, since the upper surface of each wavelength-shifting resin member 3 is made substantially parallel to the back surface of the diode 2 on which the backside electrode is formed, no chromaticity variation would be brought about among the composite light-emitting devices 5. As a result, light-emitting units that can emit radiation at a desired chromaticity can be obtained at an increased yield.

According to the fifth embodiment, one of the polishing process steps shown in FIGS. 12(d) and 13(b) may be carried out selectively. However, both of these process steps are preferably performed. This is because if the thickness of that part of the wavelength-shifting resin member 3 above the LED 1 is uniformized, then variation in chromaticity of emission can be further suppressed. As a result, the chromaticity is adjustable even more precisely.

What is claimed is:

1. A method for fabricating a semiconductor light-emitting unit, comprising the steps of:

making a light-emitting element by forming a multilayer structure on a transparent substrate and forming electrodes on the multilayer structure, the multilayer structure including first and second semiconductor layers of first and second conductivity types, respectively;

making a submount member including counter electrodes on the principal surface thereof, the counter electrodes facing the electrodes of the light-emitting element;

forming microbumps on the electrodes or on the counter electrodes;

mounting the light-emitting element facedown on the principal surface of the submount member such that the multi-layer structure faces the principal surface and that the electrodes of the light-emitting element are electrically connected to the counter electrodes via the microbumps; and coating the light-emitting element with a wavelength-shifting resin medium that will be supported on the principal surface of the submount member when cured, the wavelength-shifting resin medium containing a photofluorescent or filtering compound, the photofluorescent compound shifting the wave-length of radiation that has been emitted from the light-emitting element, the filtering compound partially absorbing the radiation.

2. A method for fabricating a semiconductor light-emitting unit, comprising the steps of:

a) making multiple light-emitting elements by forming a multilayer structure on each of a plurality of transparent substrates and forming electrodes on the multilayer structure, the multilayer structure including first and second semiconductor layers of first and second conductivity types, respectively;

b) making multiple submount members on a wafer, each said submount member including: a bonding pad on the principal surface thereof; counter electrodes that face the electrodes of associated one of the light-emitting elements; and a backside electrode on another surface thereof opposite to the principal surface;

c) forming microbumps on the electrodes or on the counter electrodes by a stud bump forming or plating technique;

d) bringing the electrodes of each said light-emitting element into contact with the counter electrodes of associated one of the submount members via the microbumps and fusing the microbumps by applying ultrasonic waves or heat thereto such that the microbumps and the associated electrodes are bonded together, thereby electrically connecting the light-emitting elements to the associated submount members and bonding the light-emitting elements onto the respective principal surfaces of the submount members;

e) coating each said light-emitting element with a wavelength-shifting resin medium that will be supported on the principal surface of the associated submount member and then curing the wavelength-shifting resin medium, thereby obtaining a plurality of composite light-emitting devices, each including one of the light-emitting elements and associated one of the submount members, the wavelength-shifting resin medium containing a photofluorescent or filtering compound, the photofluorescent compound shifting the wavelength of radiation that has been emitted from the light-emitting element, the filtering compound partially absorbing the radiation;

f) dicing the wafer, on which the composite light-emitting devices have been formed, into multiple chips;

g) securing each said composite light-emitting device, which is included on one of the chips, onto a mount of a leadframe or a wiring board such that the backside electrode of the submount member thereof is bonded to the mount via a conductive paste; and h) connecting the bonding pad of each said submount member to the associated leadframe or wiring board with a wire.

3. The method of claim 2, further comprising, between the steps d) and e), the step of polishing a light-emitting surface of the substrate for each said light-emitting element on the opposite side to another surface thereof on which the multilayer structure is formed such that the light-emitting surface becomes substantially parallel to a surface of the associated submount member on which the backside electrode is formed.

4. The method of claim 2, further comprising, between the steps e) and f), the step of polishing an outer surface of part of the wavelength-shifting resin medium above each said light-emitting element such that the outer surface becomes substantially parallel to the surface of the associated submount member on which the backside electrode is formed.

* * * * *